United States Patent
Chao et al.

(10) Patent No.: US 8,138,276 B2
(45) Date of Patent: Mar. 20, 2012

(54) SILICONE CONTAINING ENCAPSULANT

(75) Inventors: Tsung-Yi Chao, Taoyuan Hsien (TW); Wen-Jeng Lee, Taoyuan Hsien (TW); Der-Gun Chou, Taoyuan Hsien (TW); Yen-Cheng Li, Taoyuan Hsien (TW); Meng-Huang Yan, Taoyuan Hsien (TW)

(73) Assignee: Everlight USA, Inc., Pineville, NC (US)

( * ) Notice: Subject to any disclaimer, the term of this patent is extended or adjusted under 35 U.S.C. 154(b) by 211 days.

(21) Appl. No.: 12/591,860

(22) Filed: Dec. 3, 2009

(65) Prior Publication Data

US 2011/0054076 A1     Mar. 3, 2011

(30) Foreign Application Priority Data

Aug. 25, 2009    (TW) ................................ 98128474 A

(51) Int. Cl.
     *C08L 63/00*       (2006.01)
     *C08L 83/04*       (2006.01)
     *C08L 83/12*       (2006.01)
     *H01L 23/29*      (2006.01)

(52) U.S. Cl. ........................ 525/476; 525/523; 523/435

(58) Field of Classification Search ........................ None
See application file for complete search history.

(56) References Cited

U.S. PATENT DOCUMENTS 6,177,489 B1 *   1/2001   Okuse et al. .................. 523/451
2008/0105375 A1 *   5/2008   Gordon et al. ................ 156/321
2010/0193961 A1     8/2010   Konishi et al.

FOREIGN PATENT DOCUMENTS

WO    WO 2007060077 A1 *   5/2007

* cited by examiner

*Primary Examiner* — Michael J Feely
(74) *Attorney, Agent, or Firm* — Bacon & Thomas, PLLC

(57) ABSTRACT

The present invention relates to a silicone containing encapsulant composition. One embodiment of the encapsulant composition comprises (a) 30~60 weight % of an epoxy resin; (b) 30~60 weight % of an acid anhydride curing agent; (c) 0.1~30 weight % of a Carbinol function silicone resin which can form a homogeneous mixture with (a) and (b) described above; and (d) 0.1~5 weight % of a reactive UV absorber or HALS; and reactive anti-oxidant and/or phosphor containing flame retardant. The encapsulant composition can be used for a solid state light emitting device to achieve low internal stress and better -anti-yellowing performance.

19 Claims, No Drawings

SILICONE CONTAINING ENCAPSULANT

BACKGROUND OF THE INVENTION

1. Field of the Invention

The present invention relates to an encapsulant composition and, more particularly, to an encapsulant composition that can be used for a solid state light emitting device.

2. Description of Related Art

In the recent years, light emitting diodes (LEDs) have been widely used in many electronic devices such as LCD backlight sources, large displaying devices, and light illuminating equipment. Hence, demands for LEDs with high brightness have increased. Owing to the environmental requirement of various LED application, an encapsulant composition suitable for being used in light emitting devices should have certain characteristics such as being homogeneous, having high transparency, and being capable of long term storage capacity in order to resist to the high temperature when a large electrical current is applied. Conventional transparent encapsulant materials used in LEDs include epoxy or silicone resins, in which the cost of silicone resin is high though it has superior optical characteristics. In contrast, epoxy resin has been widely used due to its low cost. However, epoxy resin has a serious problem that yellowing occurs when it is used as the encapsulant composition of the LEDs. The yellowing of the epoxy resin, caused by the high temperature of the high power operation may influence the transmittance to the short-wavelength light and causing color shift. Therefore, epoxy resin is limited in its application for being used in a high current and high temperature operating environment.

The anti-yellowing of the encapsulant composition such as the epoxy resin is usually obtained by adding an antioxidant. The added antioxidant can remove the peroxide radical to stop the chain reaction, or reduce the degradation speed of the polymers by decomposing the hydroperoxide generated during the degradation. However, it is proved that the anti-yellowing obtained by adding of the antioxidant cannot be satisfactory for long operating time of the LEDs, not only suitable anti-oxidant is hard to find but also some anti-oxidants have high volatility that may result in a migration problem within the encapsulant material.

Besides, internal stress caused by high temperature during high power operation may contribute negative influence to the semiconductor element, cause a short circuit, and reduce the brightness of the applied LEDs. Therefore, for reducing the internal stress of the encapsulant composition, U.S. Pat. No. 5,145,889 has disclosed four methods, which comprise: (1) decreasing the glass transition temperature (Tg) of the encapsulant composition; (2) decreasing the linear expansion coefficient of the encapsulant composition; (3) decreasing the Young's modulus of elasticity (E); and (4) decreasing the shrinkage factor ($\epsilon$). In general, decreasing of the glass transition temperature (Tg) will lower the mechanical strength of the encapsulant at high temperature; decreasing of the Young's modulus of elasticity will dramatically decrease the adhesion of the encapsulant to chip, board, or lead frame; besides if the amount of filler increase significantly, the viscosity of the encapsulant will increase too much and is unfavorable to the workability.

In U.S. Pat. No. 6,800,373, an encapsulant composition is disclosed, which comprises silicone resin, low molecular weight of alicyclic compounds, aromatic compounds, heterocyclic compounds which having epoxy resin functional group, and siloxane surfactant. However, the optical transparency is unsatisfactory, and the siloxane surfactant is neither involved in the reaction nor does it form a homogeneous mixture with common epoxy encapsulant composition.

Therefore, it is desirable to provide an improved encapsulant composition that can be used for a solid state light emitting device to achieve low internal stress and better anti-yellowing performance.

SUMMARY OF THE INVENTION

An object of the present invention is to provide an encapsulant composition for a solid state light emitting device, such as LEDs, which can overcome the problems of yellowing and achieve low internal stress in a long term high temperature operation conditions.

To achieve the object, the present invention provide an encapsulant composition comprising: (a) 30 to 60 weight % of an epoxy resin; (b) 30 to 60 weight % of an acid anhydride curing agent; (c) 0.1 to 30 weight % of a Carbinol siloxane resin which can form a homogeneous mixture with the said (a) and (b); and (d) 0.1 to 5 weight % of a reactive UV absorber and/or a reactive hindered amine light stabilizer (HALS).

Also, the present invention provides another encapsulant composition comprising: (a) 30 to 60 weight % of an epoxy resin; (b) 30 to 60 weight % of an acid anhydride curing agent; (c) 0.1 to 30 weight % of a Carbinol siloxane resin which can form a homogeneous mixture with the said (a) and (b); (d) 0.01 to 3.0 weight % of a curing accelerator; (e) 0.1 to 5 weight % of a reactive UV absorber; and (f) 0.1 to 5 weight % of a reactive hindered amine light stabilizer (HALS). Additionally a reactive anti-oxidant and a phosphor containing flame retardant can be selectively used.

Besides, the present invention also provides a silicone containing encapsulant composition comprising: (a) 30 to 60 weight % of an epoxy resin; (b) 30 to 60 weight % of an acid anhydride curing agent; (c) 0.1 to 30 weight % of a Carbinol siloxane resin which can form a homogeneous mixture with the said (a) and (b); (d) 0.1 to 5 weight % of a normal UV absorber; and (e) 0.1 to 5 weight % of a normal hindered amine light stabilizer (HALS).

BRIEF DESCRIPTION OF THE DRAWINGS

Detailed Description of the Preferred Embodiment

The object, technique features, and advantages according to the present invention will explain later in more detail.

The present invention provide an encapsulant composition for a solid state light emitting device, such as LEDs, which can achieve low internal stress, and provide better anti-yellowing performance with long term and high temperature operation. Under the presence of epoxy resin and acid anhydride, the present invention introduce a Carbinol siloxane resin to lower the hardness and the internal stress while curing the epoxy resin composition; in addition, the use of Carbinol siloxane resin can prevent the encapsulant from cracking and overcome the problem of low adhesion. The adding of the UV absorber and the hindered amine light stabilizer (HALS) having reactive group may contribute to the increasing of the anti-yellowing ability of the encapsulant.

The addition of Carbinol siloxane resin is to react with the unreacted acid anhydride to reduce the yellowing caused by the unreacted acid anhydride left after the polymerization of epoxy resin and acid anhydride, if any. Also, the Carbinol siloxane resin can react with the reactive group of the epoxy resin to increase the elasticity of the encapsulant. Furthermore, any unreacted Carbinol siloxane resin left can serve as a filler to reduce the linear expansion coefficient of the encapsulant. According to the present invention, the Carbinol siloxane resin is a compound of the following formula:

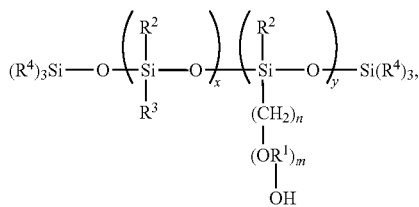

wherein $(R^1O)_m$ is an alkylene oxide group (when m=1) or a poly(alkylene oxide) group (when m>1); and $R^1$ independently represents a linear and branched divalent radical selected from $-C_2H_4-$, $-C_3H_6-$, $-C_4H_8-$. It is to be noted that when m is greater than 1, e.g., 2 or more, the alkylene oxide groups can be the same or different and can form poly(alkylene oxide) homopolymers, random copolymers and block copolymers.

$R^2$ and $R^3$ are independently H or $C_1$-$C_2$ alkyl; $R^4$ is H or $C_1$-$C_2$ alkyl and is the same with or different from $R^2$; x is an integer of 1 to 100; y is an integer of 1 to 100; n is an integer of 1 to 5; and m is an integer of 1 to 40.

Though the Carbinol siloxane resin is advantageous in lower internal stress and linear expansion coefficient, it may not solving all the yellowing problems, therefore by addition of a UV absorber and/or a hindered amine light stabilizer (HALS) having reactive group would be helpful. By controlling the amount of the Carbinol siloxane resin being used, the reactive UV absorber containing an OH or a COOH reactive group may react with the encapsulant to form a polymeric UV absorber. Hence, the volatilization due to the migration of the low molecular weight UV absorbers can be reduced, then the long lasting performance of the UV absorber can be enhanced. Since the anti-yellowing performance of this type encapsulant has been substantially increased, therefore, the long lasting requirement for LEDs can be satisfied.

The encapsulant composition of the present invention comprises: (a) 30 to 60 weight % of an epoxy resin; (b) 30 to 60 weight % of an acid anhydride curing agent; (c) 0.1 to 30 weight % of a Carbinol siloxane resin which can form a homogeneous mixture with the said (a) and (b); and (d) 0.1 to 5 weight % of a reactive UV absorber or a reactive hindered amine light stabilizer (HALS). Also, the present invention provides another encapsulant composition comprising: (a) 30 to 60 weight % of an epoxy resin; (b) 30 to 60 weight % of an acid anhydride curing agent; (c) 0.1 to 30 weight % of a Carbinol siloxane resin which can form a homogeneous mixture with the said (a) and (b); (d) 0.01 to 3.0 weight % of a curing accelerator; (e) 0.1 to 5 weight % of a reactive UV absorber; and (f) 0.1 to 5 weight % of a reactive hindered amine light stabilizer (HALS). Additionally a reactive anti-oxidant and a phosphor containing flame retardant can be selectively used.

The encapsulant composition of the present invention comprises an epoxy resin and a curing agent as the primary components, a Carbinol siloxane resin for reducing the internal stress of the encapsulant, and a UV absorber or a hindered amine light stabilizer (HALS) having reactive group, additionally a reactive anti-oxidant and a phosphor containing flame retardant can be selectively added to enhance a better anti-yellowing performance. According to the encapsulant composition of the present invention, the (a) epoxy resin may be an aromatic epoxy resin, an alicyclic epoxy resin, or a silicone modified epoxy resin; the (b) acid anhydride curing agent may be methyl hexahydrophthalic anhydride (MHHPA) or hexahydrophthalic anhydride (HHPA); the (c) Carbinol siloxane resin may be a compound of following formula:

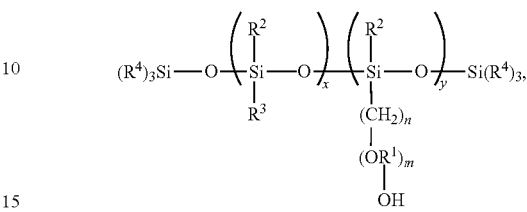

wherein $(R^1O)_m$ is an alkylene oxide group (when m=1) or a poly(alkylene oxide) group (when m>1); and $R^1$ independently represents a linear and branched divalent radical selected from $-C_2H_4-$, $-C_3H_6-$, $-C_4H_8-$. It is to be noted that when m is greater than 1, e.g., 2 or more, the alkylene oxide groups can be the same or different and can form poly(alkylene oxide) homopolymers, random copolymers and block copolymers. $R^2$ and $R^3$ are independently H or $C_1$-$C_2$ alkyl; and $R^4$ is H or $C_1$-$C_2$ alkyl and is the same with or different from $R^2$. According to a preferred embodiment of the present invention, $R^2$ and $R^4$ may be both methyl. X is an integer of 1 to 100; y is an integer of 1 to 100; n is an integer of 1 to 5; and m is an integer of 1 to 40.

For example, commercially-available products such as Silwet L-7608, CoatOSil 7604, BYK-373, BYK-377, and TEGOPREN 5842 can serve as the Carbinol siloxane resin herein.

According to another encapsulant composition of the present invention, besides the epoxy resin and curing agent as the primary components being used, a Carbinol siloxane resin may be further included to reduce the internal stress of the encapsulant, and a reactive UV absorber or a reactive hindered amine light stabilizer (HALS) having reactive group may be selectively added simultaneously. Also, a reactive anti-oxidant and a phosphor containing flame retardant can be selectively used to enhance anti-yellowing performance of the encapsulant. The detail information of the (a) epoxy resin, the (b) acid anhydride curing agent, and the (c) Carbinol siloxane resin are described as above. The (d) curing accelerator may be a tetra-alkyl ammonium salt such as tetraethylammonium bromide or tetra-n-butylammonium bromide; or a tetra-alkyl phosphonium salt such as tetraethylphosphonium bromide, tetra-n-butylphosphonium bromide, methyltri-butylphosphonium iodide, methyltri-n-butylphosphonium dimethylphosphate, or tetra-ethylphosphonium tetrafluoroborate. The reactive UV absorber may be a compound of the following formula:

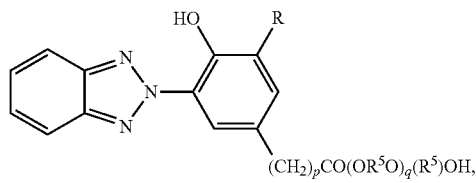

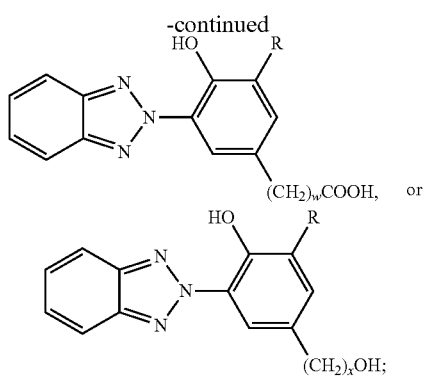

wherein p, q, w, x are each independently an integer of 1 to 5; R is H or $C_1$-$C_8$ alkyl; $R^5$ is a $C_2$-$C_4$ alkyl with straight chain or branched chain. The (f) reactive hindered amine light stabilizer (HALS) may be a compound of the following formula:

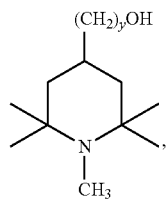

wherein y is an integer of 0 to 8.

Besides, the reactive anti-oxidant and the phosphor containing flame retardant can serve as additives to enhance anti-yellowing performance of the encapsulant. The phosphor containing flame retardant may be, for example, triphenylphosphite and 3,4:5,6-Dibenzo-2H-1,2-oxaphosphorin-2-oxide.

The encapsulant composition of the present invention is advantageous in many aspects, such as (1) low internal stress, due to the adding of the Carbinol siloxane resin; (2) excellent anti-yellowing performance, due to the adding of the UV absorber or the hindered amine light stabilizer (HALS) having reactive group and the adding of the reactive anti-oxidant and phosphor containing flame retardant; and (3) long lasting of anti-yellowing performance by forming polymeric UV absorber and/or polymeric hindered amine light stabilizers in situ, thus avoid the possibility of decreasing UV absorbers contain due to the migration and high volatility of common low molecular weight UV absorbers and/or hindered amine light stabilizers.

EXAMPLE 1

[Formulation for Table 1] Main Components

|  | Samples | | | |
|---|---|---|---|---|
|  | E1 | E2 | E3 | E4 |
| epoxy resin (wt %) | 52.4 | 51.2 | 50.3 | 48.5 |
| acid anhydride curing agent (wt %) | 47.6 | 47.5 | 47.0 | 46.1 |
| Carbinol siloxane resin A (wt %) | — | 1.3 | 2.7 | 5.4 |

The epoxy resin used herein is Bisphenol A Diglycidyl ether (NPEL-128E, purchased from Nan Ya Plastics Company), the acid anhydride curing agent used herein is methylhexahydrophthalic anhydride (MHHPA), and the Carbinol siloxane resin A used herein is Silwet L-7608 (purchased from GE Silicone Company).

Tetra alkyl phosphonium salt (curing accelerator) was added into curing agent (such as MHHPA in Table 1) at room temperature and stirring to form a solution (about 0.5 hour), additional components were then added and stirred to get a homogenous mixture. The resulting resin mixture was heated at 120° C. for 1.5 hours and then heated at 140° C. for 3.5 hours to be cured.

Films thus formed were subjected to the thermal mechanical analysis (TMA, Perkin Elmer DMA7e) to measure their internal stress ($\alpha_2/\alpha_1$) values at a testing temperature of 25 to 250° C. with the heating speed of 5° C./min. Results are listed in table 1 below.

TABLE 1

|  | Samples | | | |
|---|---|---|---|---|
|  | E1 | E2 | E3 | E4 |
| $\alpha_1$ | 61.1 | 62.98 | 73.20 | 79.74 |
| $\alpha_2$ | 187.5 | 176.08 | 191.23 | 192.0 |
| ($\alpha_2/\alpha_1$) | 3.07 | 2.80 | 2.61 | 2.41 |

EXAMPLE 2

[Formulation for Table 2] Main Components

|  | Samples | | | |
|---|---|---|---|---|
|  | E5 | E6 | E7 | E8 |
| epoxy resin (wt %) | 52.4 | 51.4 | 50.7 | 49.1 |
| acid anhydride curing agent (wt %) | 47.6 | 47.3 | 46.6 | 45.4 |
| Carbinol siloxane resin B (wt %) | — | 1.3 | 2.7 | 5.5 |

Following the same procedure as described in Example 1, except the Silwet L-7608 was replaced by CoatOSil 7604 (purchased from GE Silicone Company). The internal stress ($\alpha_2/\alpha_1$) values measured are as shown in table 2 below.

TABLE 2

|  | Samples | | | |
|---|---|---|---|---|
|  | E5 | E6 | E7 | E8 |
| $\alpha_1$ | 61.1 | 71.2 | 70.0 | 80.0 |
| $\alpha_2$ | 187.5 | 191.2 | 182.6 | 183.9 |
| ($\alpha_2/\alpha_1$) | 3.07 | 2.69 | 2.61 | 2.30 |

EXAMPLE 3

[Formulation For Table 3] Main Components

|  | Samples | | | |
| --- | --- | --- | --- | --- |
|  | E9 | E10 | E11 | E12 |
| epoxy resin (wt %) | 52.4 | 51.4 | 50.7 | 49.3 |
| acid anhydride curing agent (wt %) | 47.6 | 47.3 | 46.6 | 45.3 |
| carbinol siloxane resin C (wt %) | — | 1.3 | 2.7 | 5.4 |

Following the same procedure as described in Example 1, except the Carbinol siloxane resin C was BYK-373 (purchased from BYK Company), and the internal stress ($\alpha_2/\alpha_1$) values measured are as shown in table 3 below.

TABLE 3

|  | Samples | | | |
| --- | --- | --- | --- | --- |
|  | E9 | E10 | E11 | E12 |
| $\alpha_1$ | 61.1 | 82.9 | 83.9 | 89.7 |
| $\alpha_2$ | 187.5 | 208.0 | 201.8 | 194.7 |
| ($\alpha_2/\alpha_1$) | 3.07 | 2.51 | 2.41 | 2.17 |

According to the results shown in the above tables 1 to 3, it is believed that the use of the Carbinol siloxane resin A, B, and C can reduce the hardness of the epoxy resin and reduce the internal stress caused by the different thermo expansion coefficients of the organic material and the inorganic material. In detail, the internal stress ($\alpha_2/\alpha_1$) values decrease when the content of the Carbinol siloxane resin increases. The difference between the thermo expansion coefficients below and over the glass transition temperature decreases, which means the internal stress is efficiently reduced and the problem of cracking of the encapsulant and short circuit of the electronics can be overcome.

EXAMPLE 4

[Formulation for Table 4] Main Components

|  | Samples | | |
| --- | --- | --- | --- |
|  | E13 (blank) | E14 (experiment group) | E15 (control group) |
| epoxy resin (wt %) | 46.8 | 46.7 | 46.7 |
| Carbinol siloxane Resin A (wt %) | 5.2 | 5.1 | 5.1 |
| acid anhydride curing agent (wt %) | 48 | 48 | 48 |
| reactive UVA (wt %) | — | 0.2 | — |
| normal type UVA (wt %) | — | — | 0.2 |

The epoxy resin used herein is Bisphenol A Diglycidyl ether (NPEL-128E, purchased from Nan Ya Plastics Company), the Carbinol siloxane resin A is Silwet L-7608 (purchased from GE Silicone Company), the acid anhydride curing agent used herein is methylhexahydrophthalic anhydride (MHHPA), the reactive UVA (UV absorber) used herein is SV8A (make by Everlight Chemical Industrial Corp.), and the normal type UVA used herein is EV81 (purchased from Everlight Chemical Industrial Corp.).

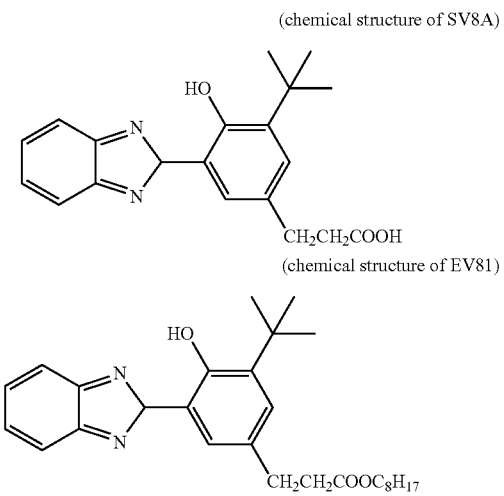

(chemical structure of SV8A)

(chemical structure of EV81)

The resin mixtures were prepared similar to the procedure described in the Example 1, except the curing time was heated at 120° C. for 2 hours and then heated at 140° C. for 4 hour.

The films (thickness of 3 mm) made from the example 4 are then placed in a QUV Accelerated Weathering Tester (Model QUV/SE with solar Eye Irradiance Control), and the testing conditions were temperature of 70° C.; 340 nm; and 1.35 w/m². A spectrophotometer (SPECTROPHOTOMETER CM-3500d/MINOLTA) is used to measure the yellowness index (YI) for before and after the exposure of UV lights, in which $\Delta YI = YI_t - YI_{t0}$. Results are listed in table 4 below.

TABLE 4

| Samples | $YI_{t0}$ | 168 hours of light exposure/ YI | 336 hours of light exposure/ YI | 168 hours of light exposure/ $\Delta YI$ | 336 hours of light exposure/ $\Delta YI$ | judgment |
| --- | --- | --- | --- | --- | --- | --- |
| E13 (blank) | −0.72 | 7.49 | 14.13 | 8.21 | 14.85 | NOT PASS |
| E14 (experiment group) | 0.57 | 1.63 | 2.52 | 1.06 | 1.95 | PASS |
| E15 (control group) | 0.68 | 2.37 | 3.80 | 1.69 | 3.12 | NOT PASS |

In the above table 4, "NOT PASS" means ΔYI value>3.00 after 336 hours of light exposure; "PASS" means ΔYI value<3.00 after 336 hours of light exposure.

EXAMPLE 5

[Formulation for Table 5] Main Components

|  | Samples | | |
| --- | --- | --- | --- |
|  | E16 (Blank) | E17 (experiment group) | E18 (control group) |
| epoxy resin (wt %) | 46.8 | 46.6 | 46.6 |
| Carbinol siloxane Resin A (wt %) | 5.2 | 5.1 | 5.1 |
| acid anhydride curing agent (wt %) | 48 | 48 | 48 |
| normal type UVA (wt %) | 0 | 0.2 | 0.2 |
| reactive hindered amine light stabilizer (wt %) | — | 0.1 | — |
| normal type hindered amine light stabilizer (wt %) | — | — | 0.1 |

Using the similar procedure as described in Example 1, the effect of hindered amine light stabilizers were measured. The reactive hindered amine light stabilizer in the present example is IA38 (purchased from Nantong City Zhenxing Fine Chemical Co., Ltd., China, the normal type hindered amine light stabilizer is EV77 (purchased from Everlight Chemical Industrial Corp.). The measured ΔYI values are as shown in table 5 below.

TABLE 5

| Samples | $YI_{t0}$ | 168 hours of light exposure/ YI | 336 hours of light exposure/ YI | 168 hours of light exposure/ ΔYI | 336 hours of light exposure/ ΔYI | judgment |
| --- | --- | --- | --- | --- | --- | --- |
| E16 (blank) | −0.72 | 7.49 | 14.13 | 8.21 | 14.85 | NOT PASS |
| E17 (experiment group) | 0.74 | 0.97 | 1.49 | 0.23 | 0.75 | PASS |
| E18 (control group) | 0.45 | 0.50 | 1.90 | 0.05 | 1.45 | PASS |

In the above table 5, "NOT PASS" means ΔYI value>3.00 after 336 hours of light exposure; "PASS" means ΔYI value<3.00 after 336 hours of light exposure.

According to the results indicated in the above tables 4 and 5, it had shown that adding the UVA and hindered amine light stabilizer (HALS) with reactive group can achieve an excellent anti-yellowing efficiency. Although the present invention has been explained in relation to its preferred embodiment, it is to be understood that many other possible modifications and variations can be made without departing from the scope of the invention as hereinafter claimed.

What is claimed is:

1. A silicone containing encapsulant composition comprising:
   (a) 30 to 60 weight % of an epoxy resin;
   (b) 30 to 60 weight % of an acid anhydride curing agent;
   (c) 0.1 to 30 weight % of a Carbinol siloxane resin which can form a homogeneous mixture with the said (a) and (b); and
   (d) 0.1 to 5 weight % of a reactive UV absorber or a reactive hindered amine light stabilizer (HALS).

2. The silicone containing encapsulant composition of claim 1, wherein the epoxy resin is selected from the group consisting of an aromatic epoxy resin, an alicyclic epoxy resin, and a silicone modified epoxy resin.

3. The silicone containing encapsulant composition of claim 1, wherein the acid anhydride curing agent is selected from the group consisting of methyl hexahydrophthalic anhydride (MHHPA) and hexahydrophthalic anhydride (HHPA).

4. The silicone containing encapsulant composition of claim 1, wherein the Carbinol siloxane resin is a compound of following formula:

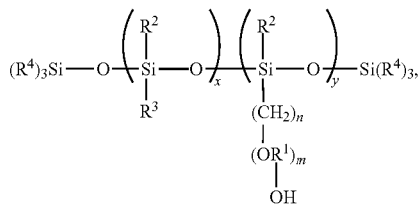

wherein $(R^1O)_m$ is an alkylene oxide group when m=1 or a poly(alkylene oxide) group when m>1; $R^1$ independently represents a linear and branched divalent radical selected from —$C_2H_4$—, —$C_3H_6$—, and —$C_4H_8$—; when m is greater than 1, the alkylene oxide groups are the same or different from each other and form poly(alkylene oxide) homopolymers, random copolymers, and block copolymers; $R^2$ and $R^3$ are independently H or $C_1$-$C_2$ alkyl; $R^4$ is H or $C_1$-$C_2$ alkyl and is the same with or different from $R^2$; x is an integer of 1 to 100; y is an integer of 1 to 100; n is an integer of 1 to 5; and m is an integer of 1 to 40.

5. The silicone containing encapsulant composition of claim 1, wherein the reactive UV absorber is at least one selected from the compound of the following formula:

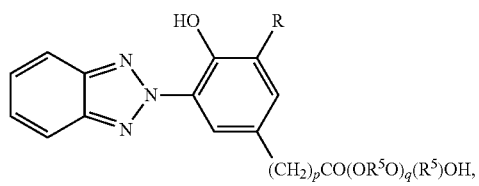

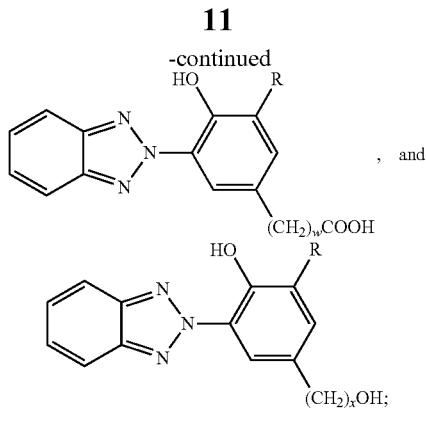

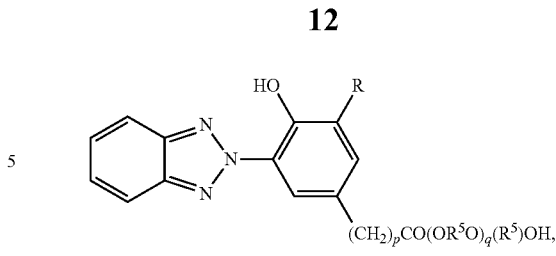

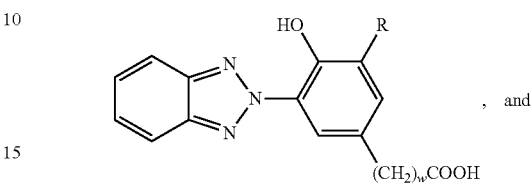

wherein p, q, w, x are each independently an integer of 1 to 5; R is H or $C_1$-$C_8$ alkyl; $R^5$ is $C_2$-$C_4$ alkyl with straight chain or branched chain.

6. The silicone containing encapsulant composition of claim 1, wherein the reactive hindered amine light stabilizer (HALS) is:

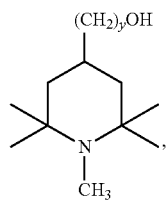

wherein y is an integer of 0 to 8.

7. The silicone containing encapsulant composition of claim 1, further comprising 0.01 to 3.0 weight % of a curing accelerator, wherein the curing accelerator is selected from the group consisting of a tetra-alkyl ammonium salt and a tetra-alkyl phosphonium salt.

8. The silicone containing encapsulant composition of claim 1, further comprising 0.1 to 5 weight % of a reactive anti-oxidant and/or phosphor containing flame retardant.

9. The silicone containing encapsulant composition of claim 1, wherein the silicone containing encapsulant composition is used in LED encapsulation.

10. A silicone containing encapsulant composition comprising:
   (a) 30 to 60 weight % of an epoxy resin;
   (b) 30 to 60 weight % of an acid anhydride curing agent;
   (c) 0.1 to 30 weight % of a Carbinol siloxane resin which can form a homogeneous mixture with the said (a) and (b);
   (d) 0.01 to 3.0 weight % of a curing accelerator;
   (e) 0.1 to 5 weight % of a reactive UV absorber; and
   (f) 0.1 to 5 weight % of a reactive hindered amine light stabilizer (HALS).

11. The silicone containing encapsulant composition of claim 10, wherein the curing accelerator is selected from the group consisting of a tetra-alkyl ammonium salt and a tetra-alkyl phosphonium salt.

12. The silicone containing encapsulant composition of claim 10, wherein the reactive UV absorber is at least one selected from the compound of the following formula:

wherein p, q, w, x are each independently an integer of 1 to 5; R is H or a $C_1$-$C_8$ alkyl; $R^5$ is $C_2$-$C_4$ alkyl with straight chain or branched chain.

13. The silicone containing encapsulant composition of claim 10, wherein the reactive hindered amine light stabilizer (HALS) is the compound of the following formula:

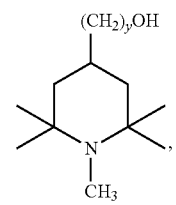

wherein y is an integer of 0 to 8.

14. The silicone containing encapsulant composition of claim 10, further comprising 0.1 to 5 weight % of a reactive anti-oxidant and/or phosphor containing flame retardant.

15. The silicone containing encapsulant composition of claim 10, wherein the silicone containing encapsulant is used in LED encapsulation.

16. An epoxy encapsulant composition comprising:
   (a) 30 to 60 weight % of an epoxy resin;
   (b) 30 to 60 weight % of an acid anhydride curing agent;
   (c) 0.1 to 30 weight % of a Carbinol siloxane resin which can form a homogeneous mixture with the said (a) and (b);
   (d) 0.1 to 5 weight % of a reactive UV absorber or a reactive hindered amine light stabilizer (HALS); and
   (e) 0.1 to 5 weight % of a reactive anti-oxidant and/or phosphor containing flame retardant.

17. The epoxy containing encapsulant composition of claim 16, wherein the reactive UV absorber is at least one selected from the compound of the following formula:

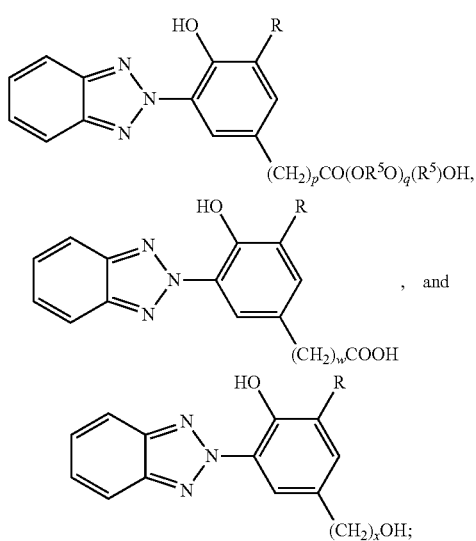

wherein p, q, w, x are each independently an integer of 1 to 5; R is H or $C_1$-$C_8$ alkyl; $R^5$ is $C_2$-$C_4$ alkyl with straight chain or branched chain.

18. The epoxy containing encapsulant composition of claim 16, wherein the reactive hindered amine light stabilizer (HALS) is:

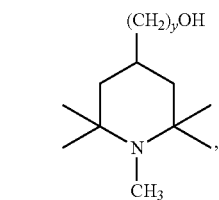

wherein y is an integer of 0 to 8.

19. A silicone containing encapsulant composition comprising:
(a) 30 to 60 weight % of an epoxy resin;
(b) 30 to 60 weight % of an acid anhydride curing agent;
(c) 0.1 to 30 weight % of a Carbinol siloxane resin which can form a homogeneous mixture with the said (a) and (b);
(d) 0.1 to 5 weight % of a non-reactive UV absorber; and
(e) 0.1 to 5 weight % of a non-reactive hindered amine light stabilizer (HALS).

* * * * *